(12) United States Patent
Kencke et al.

(10) Patent No.: US 6,313,486 B1
(45) Date of Patent: Nov. 6, 2001

(54) FLOATING GATE TRANSISTOR HAVING BURIED STRAINED SILICON GERMANIUM CHANNEL LAYER

(75) Inventors: David L. Kencke, Portland, OR (US); Sanjay K. Banerjee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/595,366

(22) Filed: Jun. 15, 2000

(51) Int. Cl.[7] .......................... H01L 29/788; H01L 29/12
(52) U.S. Cl. ..................... 257/192; 257/191; 257/316; 257/616
(58) Field of Search .................... 257/191, 192, 257/316, 322, 616

(56) References Cited

U.S. PATENT DOCUMENTS

| | | |
|---|---|---|
| 4,499,557 | 2/1985 | Holmberg et al. .................... 365/163 |
| 4,599,705 | 7/1986 | Holmberg et al. .................... 365/163 |
| 4,870,470 | 9/1989 | Bass, Jr. et al. .................... 357/23.5 |
| 5,162,880 | 11/1992 | Hazama et al. ...................... 257/106 |
| 5,272,365 * | 12/1993 | Nakagawa ............................. 257/192 |
| 5,334,855 | 8/1994 | Moyer et al. .......................... 257/13 |
| 5,341,328 | 8/1994 | Ovshinsky et al. .................. 365/163 |
| 5,349,209 | 9/1994 | Moyer et al. .......................... 257/80 |
| 5,432,356 | 7/1995 | Imamura ................................ 257/24 |
| 5,451,800 * | 9/1995 | Mohammad ........................ 257/192 |
| 5,534,712 | 7/1996 | Ovshinksy et al. ..................... 217/3 |
| 5,534,713 * | 7/1996 | Ismail et al. ......................... 257/192 |
| 5,546,340 | 8/1996 | Hu et al. ............................ 365/185.3 |
| 5,659,504 | 8/1997 | Bude et al. ...................... 365/185.27 |
| 5,698,869 | 12/1997 | Yoshimi et al. ...................... 257/192 |
| 5,801,396 | 9/1998 | Chan et al. ............................. 257/65 |
| 5,818,761 | 10/1998 | Onakado et al. ............... 365/185.13 |
| 5,821,136 | 10/1998 | Chan et al. ........................... 438/158 |
| 5,821,577 * | 10/1998 | Crabbe et al. ....................... 257/192 |
| 5,901,084 | 5/1999 | Ohnakado ........................ 365/185.18 |
| 5,926,414 | 7/1999 | McDowel et al. .................... 365/170 |
| 5,986,581 | 11/1999 | Magdaleno, II et al. ............ 340/953 |
| 5,991,200 | 11/1999 | Seki et al. ........................ 365/185.18 |
| 6,013,950 | 1/2000 | Nasby ................................... 257/34 |
| 6,031,263 | 2/2000 | Forbes et al. ......................... 257/315 |
| 6,207,978 * | 3/2001 | Fastow ................................. 257/192 |

* cited by examiner

*Primary Examiner*—Gene M. Munson
(74) *Attorney, Agent, or Firm*—Townsend and Townsend and Crew LLP; Henry K. Woodward

(57) ABSTRACT

A field effect transistor such as a flash EEPROM device has channel region between a source region and a drain region with the channel region including a silicon germanium alloy layer epitaxially grown on a silicon substrate and a silicon cap layer epitaxially grown on the alloy layer. A floating gate is provided over and insulated from the channel region, and a control gate is provided over and insulated from the floating gate. The silicon germanium alloy layer and cap silicon layer provide for enhanced secondary impact ionization when injecting electrons from the channel region into the floating gate in programming the device. In a preferred embodiment the SiGe alloy layer is graded with the germanium mole fraction increasing from zero to some maximum value in the growth direction and with the germanium layer thickness being below a critical thickness for maintaining pseudomorphic strain.

14 Claims, 3 Drawing Sheets

FLOATING GATE TRANSISTOR HAVING BURIED STRAINED SILICON GERMANIUM CHANNEL LAYER

CROSS-REFERENCES TO RELATED APPLICATIONS

This patent application is related to copending application Ser. No. 09/596,006 filed concurrently herewith, for VERTICAL CHANNEL FLOATING GATE TRANSISTOR HAVING SILICON ERMANIUM CHANNEL LAYER.

BACKGROUND OF THE INVENTION

This invention relates generally to field effect transistors, and more particularly the invention relates to insulated field effect transistors (IGFETS) and metal oxide silicon transistors (MOS) having a floating gate for use in electrically erasable, programmable read-only memory (EEPROM) cells as Flash EEPROM cells.

The MOS transistor has source and drain regions separated by a channel region with the conduction of the channel region controlled by voltage biasing an overlying gate. The Flash EEPROM device has the structure of a metal-oxide-semiconductor field effect transistor (MOSFET) but additionally includes an electrically isolated gate, or floating gate, to store charge. Controlling the amount of charge on the floating gate alters the threshold voltage and creates a nonvolatile memory function. The cell is read in the same manner as a MOSFET. Flash memory development is therefore driven by some of the same concerns as MOS technology, but to the demands for scalable devices with high access times and low leakage currents, it adds the requirement of efficient, controllable gate currents, and channel hot electron (CHE) programming used in conventional flash cells. As the drain and gate voltages are lowered, however, this method becomes less efficient.

Since flash memory is used mostly in mobile applications, low power operation is desirable. For programming with lower drain and gate voltages, a negative substrate voltage may be applied that produces a different programming mechanism that is more effective than CHE programming at these lower voltages. Channel initiated secondary electron (CHISEL) injection occurs when a substrate bias is applied, and the mechanism is also known as substrate current induced hot electron (SCHE) injection. Channel electrons gain energy as they travel to the drain and produce primary impact ionization. The holes generated in the drain then travel back across the drain junction and gain energy as they pass through the depletion region where they can produce secondary impact ionization (SII). the secondary electrons created by SII can travel back to the Si-SiO$_2$ interface and be injected into the floating gate.

The present invention is directed to a floating gate field effect transistor in which secondary electron injection is enhanced when programming the floating gate.

SUMMARY OF THE INVENTION

In accordance with the invention, a field effect transistor comprises a semiconductor body having source and drain regions formed in spaced surface regions of the semiconductor. A channel region between the source and drain regions includes a compressively strained Si$_x$Ge$_{1-x}$ alloy layer with a silicon cap layer over the alloy layer. Conduction in the channel region is controlled by a gate structure including a control gate over the channel region and a floating gate between the control gate and the channel region.

The voltage threshold of the transistor is programmed by selectively injecting electrons from the channel region into the floating gate. Lower programming voltages are realized due to increased secondary impact ionization with the presence of the heterostructure interface in the channel and the smaller bandgap of the silicon-germanium layer.

In a preferred embodiment, the Si$_x$Ge$_{1-x}$ layer is grown on a silicon substrate with a graded mole fraction, 1-x, increasing from 0 to a desired maximum end of growth direction. The maximum value is then maintained during the remainder of the Si$_x$Ge$_{1-x}$ layer growth, and the whole alloy layer is kept below a critical thickness that maintains pseudomorphic strain. A cap layer of silicon is then epitaxially grown on top of the alloy layer that serves as a channel for the device.

The invention and objects and features thereof will be more readily apparent from the following detailed description and appended claims when taken with the drawings.

BRIEF DESCRIPTION OF THE DRAWINGS

Like elements in the drawings have the same reference numerals.

DETAILED DESCRIPTION OF ILLUSTRATIVE EMBODIMENTS

Figure 1:
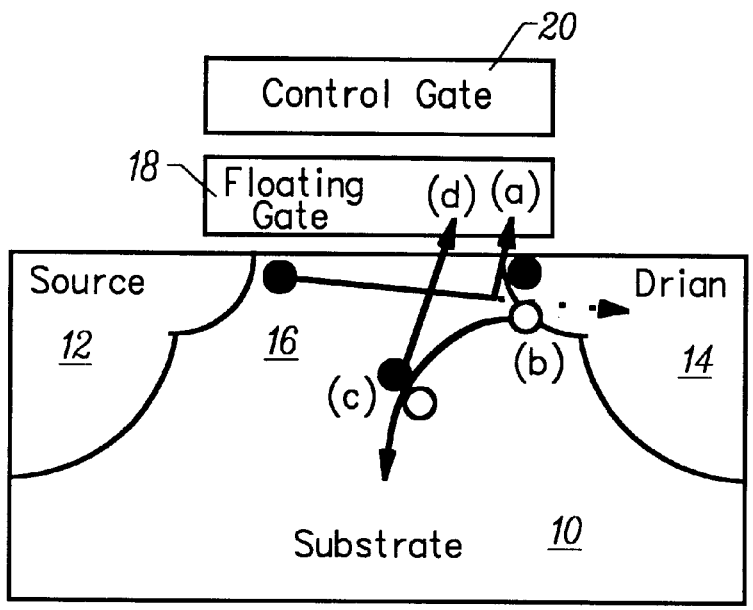
FIG. 1 is a section view of a flash memory device illustrating the programming of the floating gate by primary and secondary impact ionization.

FIG. 1 is a section view of a field effect transistor formed in a P-doped noncrystalline silicon substrate 10 having spaced N-doped source region 12 and N-doped drain region 14 with channel region 16 therebetween. A floating gate 18 and control gate 20 are positioned above the channel region for controlling conduction thereof. Floating gate 18 is formed on a gate silicon oxide layer, and control gate 20 is formed on an intergate oxide layer. In programming floating gate 18, channel hot electron (CHE) injection may occur at (a) when channel electrons gain energy and are redirected into the floating gate. Channel electrons may also produce primary impact ionization at the drain (b) and the resulting holes in the substrate current may produce secondary impact ionization (c). The generated secondary electrons can form a channel-initiated secondary electron (CHISEL) gate current at (d) that is significantly enhanced by a negative substrate bias.

Figure 2:
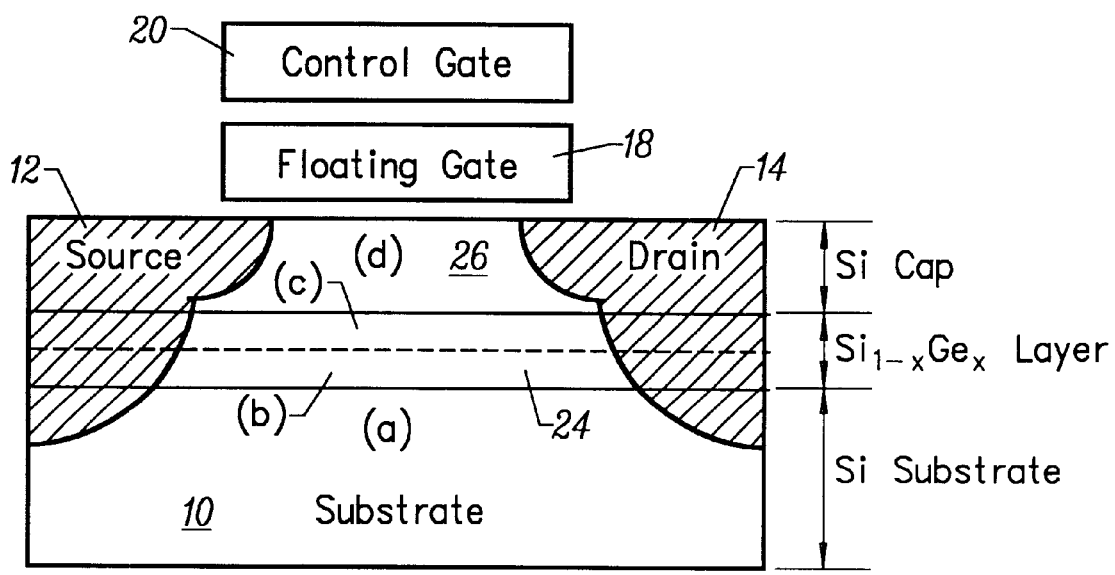
FIG. 2 is a section view of a flash memory device in accordance with one embodiment of the invention.

As noted above, as the drain and gate voltages are lowered channel hot electron (CHE) programming as is conventionally employed becomes less efficient. FIG. 2 is a section view of a field effect transistor having a floating gate and control gate in accordance with one embodiment of the invention which addresses this limitation. Again, a silicon substrate 10 includes a source region 12 and drain region 14 with a floating gate 18 and a control gate 20 overlying the channel region. However, in accordance with the invention channel region 16 includes a silicon-germanium alloy layer ($Si_{1-x}Ge_x$) 24 which is epitaxially grown on substrate 10 by molecular beam epitaxy (MBE) or other conventional techniques with a silicon cap layer 26 epitaxially grown on the alloy layer 24. In accordance with a preferred embodiment of the invention, the mole fraction of Ge in the $Si_xGe_{1-x}$ layer is graded from zero to a maximum in the region (b) and then the mole fraction is maintained for the rest of the layer (c).

Figure 3:
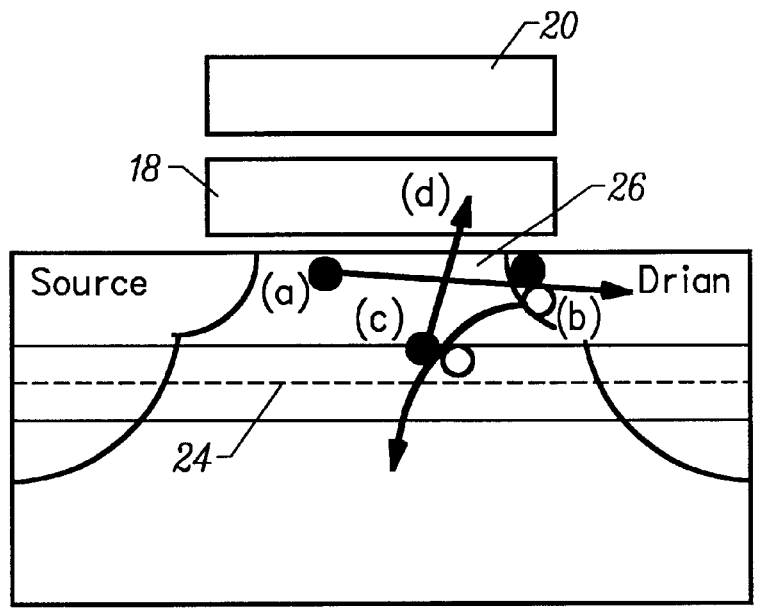
FIG. 3 is the section view of FIG. 2 and further illustrates the electron injection mechanism of the invention.

FIG. 3 illustrates the charge injection mechanism of the device of FIG. 2. Channel electrons (a) again produce primary impact ionization at (b) in the silicon cap layer 26. The holes can gain energy in the silicon cap and then produce secondary impact ionization (SII) in the $Si_xGe_{1-x}$ layer 24 at (c). The secondary electrons then may be injected into the floating gate 18 at (d) as the holes escape into the substrate.

Figure 4:
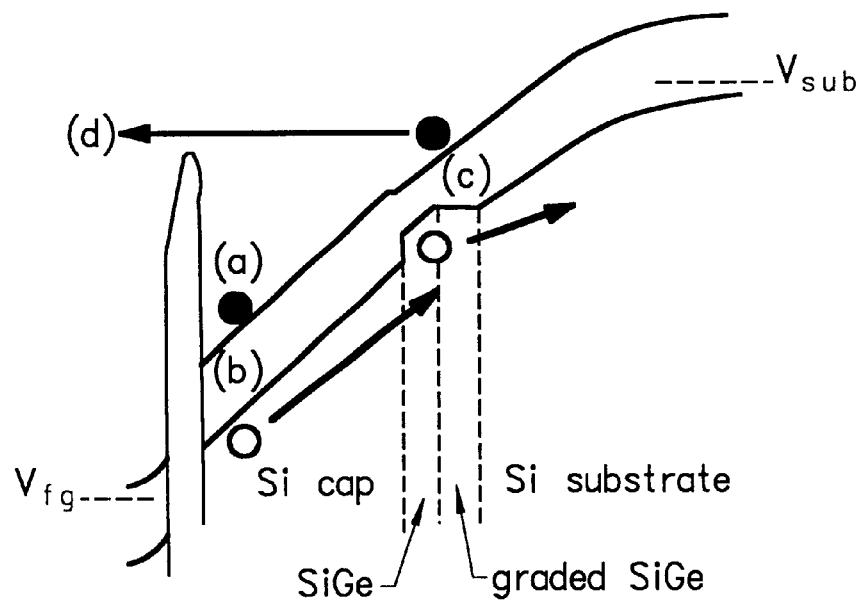
FIG. 4 illustrates a valence/conduction band diagram of the electron injection mechanism in accordance with the invention.

The heterostructure of FIG. 2 enhances the channel initiated secondary electron injection (CHISEL) since the holes generated by primary impact ionization in the drain and traveling toward the substrate gain additional energy from the valence band offset at the heterostructure interface and therefore are more likely to produce a greater amount of secondary impact ionization closer to the $Si-SiO_2$ surface between silicon layer 26 and floating gate 18, as illustrated by the valence-conduction band diagram of the injection mechanism shown in FIG. 4. Here channel electrons in the conduction band (a) produce holes by impact ionization (b). The holes traveling to the substrate gain energy at the valence band offset and have higher input ionization rates in the $Si_xGe_{1-x}$ region (c) before escaping to the substrate through the grading of the SiGe alloy region. The secondary electrons may be injected into the floating gate at (d).

Secondary impact ionization is further enhanced by the smaller energy needed to create electron-hole pairs because the silicon-germanium bandgap is smaller. The lower threshold for impact ionization in the SiGe layer again produces more secondary electrons closer to the $Si-SiO_2$ surface than a device without a $Si_xGe_{1-x}$ layer. Further, the SiGe layer may also help by widening the flow of the substrate current and producing secondary input ionization further in the channel toward the source side, where the secondary electrons are more likely to be directed toward the $Si-SiO_2$ interface.

Simulation of CHISEL injection has indicated an enhanced gate current in the device according to the invention. A multiple stage Monte Carlo simulation method (IEEE IEDM Technical Digest, p. 889, 1998) was modified with simple models to account for $Si_xGe_{1-x}$ bandgaps, offsets, and scattering mechanisms. Devices with 0.18 $\mu$m gate lengths were simulated. The devices were simulated with uniform substrate doping of $6 \times 10^{17}$ $cm^{-3}$, thin 40 Å gate oxides, shallow source/drain extensions (50 nm) and a 60 nm silicon cap thickness. $Si_xGe_{1-x}$ critical layer thicknesses of 120, 60, 20, 10, and 5 nm were assumed for maximum mole fractions, 1−x, of 20, 30, 40, 50, and 60%, respectively. these devices were simulated with 1.8 V on the gate, 2.7 V on the drain, and −2.7 V on the substrate.

Figure 5:
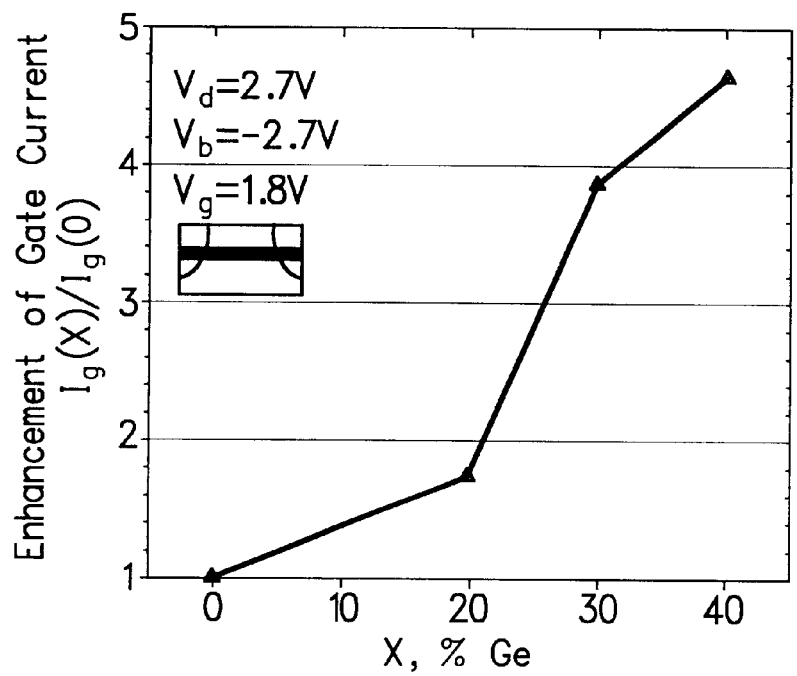
FIG. 5 is a graph of enhancement of gate current versus percentage of germanium for varying maximum mole fractions.

The $Si_xGe_{1-x}$ ., flash devices showed improved gate injection up to 4.7 times (FIG. 5). For layers with a maximum Ge mole fraction of 0.4, an analysis of the injection mechanism showed that 93% of the CHISEL injection was formed by secondary electrons originating in the $Si_xGe_{1-}$ layer.

Figure 6:
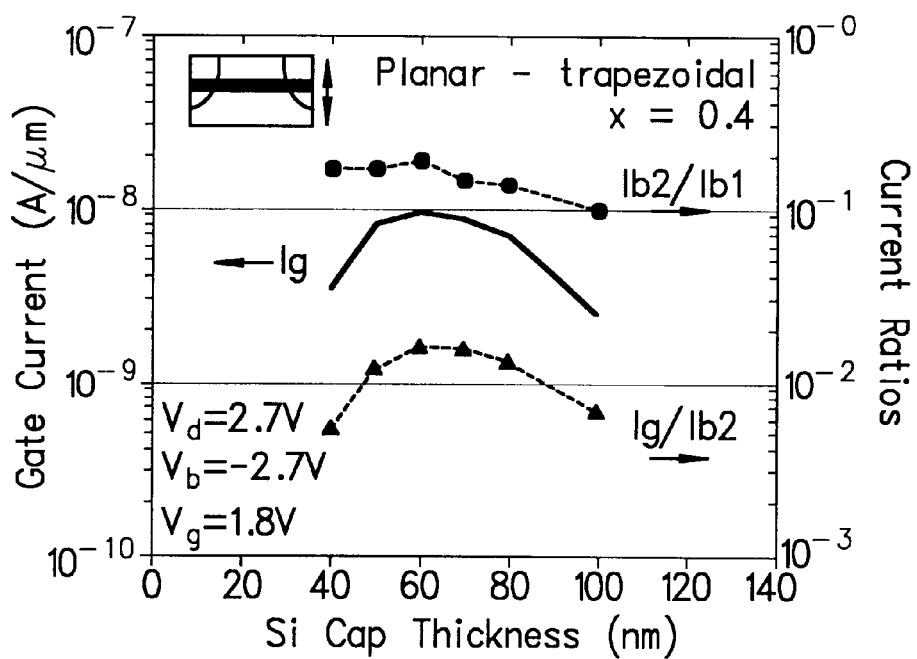
FIG. 6 is a graph of gate current and current ratios versus silicon cap thickness which illustrates dependence of the gate injection on the placement of the silicon germanium alloy layer.

Use of the silicon-germanium epitaxial layer in the device in accordance with the invention provides better device characteristics as cell size scales down since offset in the valence band gives holes in the substrate current a greater energy to produce secondary impact ionization. The smaller bandgap further enhances impact ionization, and the alloy layer can be optimized in position and thickness to better control the programming gate current as illustrated in FIG. 6. Here dependence on the gate injection (solid line) on the placement of the $Si_{-Ge1-x}$ layer is illustrated. The maximum mole fraction in the layer was 0.4, and the ratios of total primary to secondary impact ionization (circles) and gate current to total secondary impact ionization (triangles) are also shown.

The SiGe alloy layer also allows a separate silicon cap to be grown on top so that the channel can be separately engineered from the region where secondary electrons are created. For instance, the channel might be low doped for high mobility and read current, and the SiGe layer heavily doped to generate secondary impact ionization. The silicon cap is an important feature of the device. While the use of SiGe epitaxial layers has previously been suggested for enhanced secondary electron injection, alloy scattering has been theoretically seen to prevent the enhancement of impact ionization in $Si_xGe_{1-x}$ alloys. However, the device in accordance with the invention allows holes to gain energy in the silicon cap layer before they cross into the $Si_xGe_{1-x}$ layer. The holes thus accelerate in the silicon cap region but produce secondary impact ionization in the separate $Si_xGe_{1-x}$ region.

Additionally, the grading of the $Si_{x\ Ge1-x}$ layer is an important feature of the device. The grading of Ge content provides a smooth transition from the $Si_xGe_{1-x}$ layer and the silicon substrate, without a valence band discontinuity that might trap the escaping holes in the SiGe layer or redirect them towards the source. If the holes were injected into the source junction, they would forward-bias the junction and could initiate a bipolar breakdown effect that would prevent the coupling of the substrate voltage into the channel.

Thus, the heterostructure of the channel solves problems that flash memory arrays face as size and voltages are scaled. At lower drain voltages, channel hot electron (CHE) programming becomes less effective, and the structure in accordance with the invention alloys secondary electron injection to be used. Additionally, leakage currents become magnified as more devices are included in larger arrays, and the lower voltages together with a substrate voltage used in the device according to the invention produces less leakage current during programming.

While the device in accordance with the invention is fabricated using conventional semiconductor processing, the epitaxial layers require more processing and therefore can increase the cost of production. However, these additional steps are taken at the beginning of the process flow, and as strained layer technology becomes more widespread, such steps will become routine. An important limitation is that the subsequent thermal budget be restricted to avoid relaxation in the metastable strained $Si_xGe_{1-}$layer.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A field effect transistor comprising:
   a) a silicon substrate,
   b) a source region and a drain region formed in spaced surface regions of the substrate,
   c) a channel region between the source region and the drain region, the channel region including a $Si_xGe_{1-x}$ alloy layer epitaxially grown on the silicon substrate and a silicon cap layer epitaxially grown on the alloy layer,
   d) a floating gate over and insulated from the channel region, and
   e) a control gate over and insulated from the floating gate.

2. The field effect transistor as defined by claim 1 wherein the $Si_xGe_{1-x}$ alloy layer is graded.

3. The field effect transistor as defined by claim 2 wherein the $Si_xGe_{1-x}$ alloy layer is graded from 1−x=0 to a maximum value in the growth direction.

4. The field effect transistor as defined by claim 3 wherein the $Si_xGe_{1-x}$ layer is compressively strained.

5. The field effect transistor as defined by claim 4 wherein the thickness of the $Si_xGe_{1-x}$ layer is below a critical value to maintain pseudomorphic strain.

6. The field effect transistor as defined by claim 1 wherein the $Si_xGe_{1-x}$ layer is compressively strained.

7. The field effect transistor as defined by claim 6 wherein the thickness of the $Si_xGe_{1-x}$ layer is below a critical value to maintain pseudomorphic strain.

8. The field effect transistor as defined by claim 1 wherein the $Si_xGe_{1-x}$ alloy layer and the silicon cap layer extend into the source region and the drain region.

9. The field effect transistor as defined by claim 8 wherein the silicon substrate has a monocrystalline lattice structure.

10. The field effect transistor as defined by claim 1 wherein the silicon substrate has a monocrystalline lattice structure.

11. A flash EEPROM device having improved electron injection for programming comprising a monocrystalline silicon body having spaced source and drain regions with a channel therebetween, the channel including a graded SiGe alloy layer epitaxially grown on the silicon body and a cap silicon layer epitaxially grown on the SiGe layer, and a gate structure overlying the channel region including a control gate and floating gate between the control gate and the channel region, the control gate and the floating gate being dielectrically isolated from each other and the semiconductor body.

12. The flash EEPROM device as defined by claim 11 wherein the SiGe alloy layer is compressively strained.

13. The flash EEPROM device as defined by claim 12 wherein the alloy layer is $Si_xGe_{1-x}$ and is graded from 1−x=0 to 1−x being a maximum value.

14. The flash EEPROM device as defined by claim 13 wherein the SiGe layer and the cap layer extend into the source and drain.

* * * * *